(12) United States Patent
Chang et al.

(10) Patent No.: US 10,056,293 B2
(45) Date of Patent: Aug. 21, 2018

(54) TECHNIQUES FOR CREATING A LOCAL INTERCONNECT USING A SOI WAFER

(71) Applicant: International Business Machines Corporation, Armonk, NY (US)

(72) Inventors: Josephine B. Chang, Mahopac, NY (US); Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/335,328

(22) Filed: Jul. 18, 2014

(65) Prior Publication Data
US 2016/0020138 A1    Jan. 21, 2016

(51) Int. Cl.
*H01L 21/768* (2006.01)
*H01L 21/762* (2006.01)
(Continued)

(52) U.S. Cl.
CPC ...... *H01L 21/76898* (2013.01); *H01L 21/743* (2013.01); *H01L 21/76224* (2013.01);
(Continued)

(58) Field of Classification Search
CPC ............. H01L 21/76895; H01L 21/743; H01L 21/76264; H01L 21/76283; H01L 21/76251; H01L 27/1203
See application file for complete search history.

(56) References Cited

U.S. PATENT DOCUMENTS 5,950,090 A * 9/1999 Chen ................ H01L 21/76224
  438/296
7,208,815 B2 * 4/2007 Chen ............... H01L 21/823807
  257/347
(Continued)

FOREIGN PATENT DOCUMENTS

TW      569317 B    1/2004

OTHER PUBLICATIONS

Hartman et al., "Selective epitaxial growth of boron- and phosphorous-doped Si and SiGe for raised sources and drains", Journal of Crystal Growth 264, 2004, pp. 36-47.*
(Continued)

*Primary Examiner* — Yu Chen
*Assistant Examiner* — Vincent Wall
(74) *Attorney, Agent, or Firm* — Louis J. Percello; Michael J. Chang, LLC (57) ABSTRACT

In one aspect, a method of forming a local interconnect structure includes the steps of: forming a BOX SOI wafer having a fully depleted seed layer between a first BOX layer and a second BOX layer, and an active layer over the second BOX layer; forming at least one STI region in the active layer having an STI oxide; forming at least one trench that extends through the STI oxide and the second BOX layer down to the seed layer, wherein the trench has a footprint and a location such that a portion of the STI oxide remains lining sidewalls of the trench; and growing an epitaxial material in the trench using the seed layer as a template for the growth, wherein the epitaxial material is doped and serves as the local interconnect structure which is buried in the double BOX SOI wafer.

11 Claims, 6 Drawing Sheets

(51) Int. Cl.
*H01L 21/84* (2006.01)
*H01L 21/74* (2006.01)
*H01L 27/12* (2006.01)
*H01L 23/528* (2006.01)

(52) U.S. Cl.
CPC .. *H01L 21/76251* (2013.01); *H01L 21/76264* (2013.01); *H01L 21/76283* (2013.01); *H01L 21/76877* (2013.01); *H01L 21/76895* (2013.01); *H01L 21/84* (2013.01); *H01L 23/5283* (2013.01); *H01L 27/1203* (2013.01)

(56) References Cited

U.S. PATENT DOCUMENTS

| | | | | |
|---|---|---|---|---|
| 7,525,121 | B2 * | 4/2009 | Hsu | H01L 21/76283 257/350 |
| 7,767,546 | B1 * | 8/2010 | Dennard | H01L 21/76254 257/E21.32 |
| 7,781,800 | B2 | 8/2010 | Chen et al. | |
| 7,825,036 | B2 | 11/2010 | Yao et al. | |
| 8,227,865 | B2 * | 7/2012 | Dennard | H01L 21/76254 257/347 |
| 8,367,550 | B2 | 2/2013 | Park et al. | |
| 8,415,771 | B1 | 4/2013 | Golda et al. | |
| 2002/0031890 | A1 * | 3/2002 | Watanabe | H01L 21/76224 438/296 |
| 2010/0019385 | A1 * | 1/2010 | Bartley | H01L 21/76898 257/741 |
| 2011/0140232 | A1 * | 6/2011 | Gaul | H01L 21/76283 257/508 |

OTHER PUBLICATIONS

Daembkes et al., "The n-Channel SiGe/Si modulation-doped field-effect transistor", IEEE Trans. Elec. Dev., vol. 33, No. 5, May 1986, pp. 633-638.*
Machine translation of TW 569317.*
Jeong et al., "Si via interconnection technique for 3D MEMS package," IEEE Sensors 2006, EXCO, Daegu, Korea/Oct. 22-25, 2006.
English Abstract of TW569317B, Wei Zin-Chein; Taiwan Semiconductor MFG, Jan. 2004 (accessed Jul. 2014).

* cited by examiner

TECHNIQUES FOR CREATING A LOCAL INTERCONNECT USING A SOI WAFER

FIELD OF THE INVENTION

The present invention relates to interconnect structures, and more particularly, to techniques for forming epitaxial buried local interconnect structures in a double buried oxide (BOX) silicon-on-insulator (SOI) wafer.

BACKGROUND OF THE INVENTION

Local interconnect structures are used to electrically connect different transistors fabricated on a common substrate. First and second metal layers are typically used to make these electrical contacts between certain regions of the wafer. In circuits requiring densely connected small devices, however, wiring, not active device footprint, is often the space-limiting factor.

Specifically, the first and second metallization layers seriously limit the density of many frequently used integrated circuits. For example, in conventional techniques metal layers are used to connect gates in a cross couple configuration which significantly limits density scaling due to constraints on first metal layer patterning.

Thus, a need exists to solve the local interconnect density problem to ensure continuous scaling.

SUMMARY OF THE INVENTION

The present invention provides techniques for forming epitaxial buried local interconnect structures in a double buried oxide (BOX) silicon-on-insulator (SOI) wafer. In one aspect of the invention, a method of forming a local interconnect structure is provided which includes the steps of: forming a double buried oxide (BOX) silicon-on-insulator (SOI) wafer having a fully depleted seed layer between a first BOX layer and a second BOX layer, and an active layer over the second BOX layer; forming at least one shallow trench isolation (STI) region in the active layer having an STI oxide; forming at least one trench that extends through the STI oxide and the second BOX layer down to the seed layer, wherein the trench has a footprint and a location such that a portion of the STI oxide remains lining sidewalls of the trench; and growing an epitaxial material in the trench using the seed layer as a template for the growth, wherein the epitaxial material is doped and serves as the local interconnect structure which is buried in the double BOX SOI wafer.

In another aspect of the invention, a local interconnect structure is provided. The local interconnect structure includes a double BOX SOI wafer having a fully depleted seed layer between a first BOX layer and a second BOX layer, and an active layer over the second BOX layer; at least one STI region in the active layer having an STI oxide; at least one trench that extends through the STI oxide and the second BOX layer down to the seed layer, wherein the trench has a footprint and a location such that a portion of the STI oxide lines sidewalls of the trench; and an epitaxial material grown in the trench with a crystallographic orientation templated from the seed layer, wherein the epitaxial material is doped and serves as the local interconnect structure which is buried in the double BOX SOI wafer.

In yet another aspect of the invention, a circuit is provided. The circuit includes a double BOX SOI wafer having a fully depleted seed layer between a first BOX layer and a second BOX layer, and an active layer over the second BOX layer; at least one STI region in the active layer having an STI oxide; at least one trench that extends through the STI oxide and the second BOX layer down to the seed layer, wherein the trench has a footprint and a location such that a portion of the STI oxide lines sidewalls of the trench; an epitaxial material grown in the trench with a crystallographic orientation templated from the seed layer, wherein the epitaxial material is doped and serves as a local interconnect structure which is buried in the double BOX SOI wafer; and contact studs connecting the local interconnect structure with one or more regions of the active layer.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques which address the above-described wiring density issues by employing a double buried oxide (BOX) wafer configuration wherein a fully depleted silicon layer between the double BOX layers is used as a seed layer to epitaxially grow buried local interconnects in the wafer. By burying some of the local interconnects in the wafer in this manner serves to free up space on the surface of the wafer. Further, forming epitaxial buried local interconnects in accordance with the present techniques has notable advantages as compared to, for example, simply putting in metal wires. For instance, the present local interconnect material (e.g., epitaxial silicon) is front-end compatible (materials wise and thermal budget) and having an epitaxially grown crystalline (e.g., silicon) material (rather than an amorphous material) reduces the resistance of the local interconnect.

The present techniques will now be described in detail by way of reference to FIGS. 1-11. As highlighted above, the starting platform for the present process is a double BOX wafer. See FIG. 1. In the exemplary embodiment shown illustrated in FIG. 1, the double BOX wafer 101 includes a substrate 102, a first BOX layer 104 (labeled "BOX 1") on the substrate 102, a seed layer 106 on a side of the first BOX layer 104 opposite the substrate 102, a second BOX layer 108 (labeled "BOX 2") on a side of the seed layer 106 opposite the first BOX layer, and an active layer 110 (also referred to herein as a "device layer") on a side of the second BOX layer 108 opposite the seed layer 106.

Figure 1:
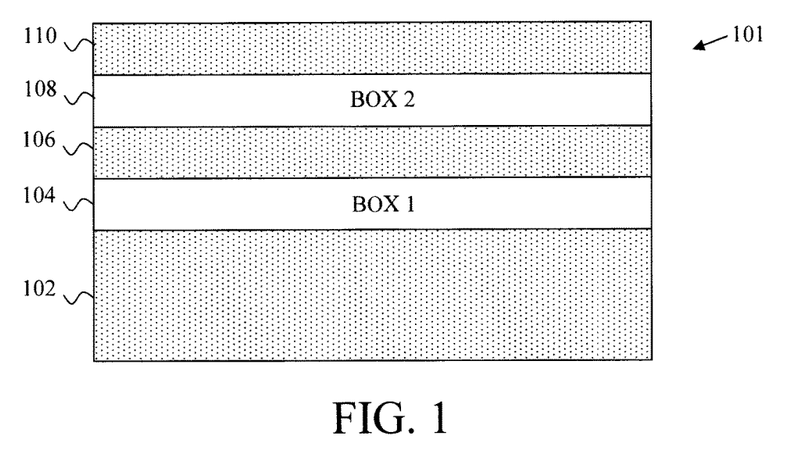
FIG. 1 is a cross-sectional diagram illustrating a starting platform for forming buried local interconnects which includes a wafer having a fully depleted silicon layer between a first and a second buried oxide (BOX) layer (a double BOX) and an active layer over the second BOX layer according to an embodiment of the present invention.

Any conventional way known in the art can be used to form the double BOX wafer 101. The one specification here is that the seed layer 106 is fully depleted which means that the seed layer 106 is undoped and relatively thin. For example, the seed layer 106 preferably has a thickness of less than about 200 nanometers (nm), e.g., from about 15 nm to about 45 nm, and ranges therebetween.

By way of example only, the double BOX wafer 101 may be formed by starting with a preformed silicon-on-insulator (SOI) wafer. An SOI wafer generally includes a SOI layer separated from a substrate by a BOX. The substrate, e.g., a silicon (Si) substrate, would serve as the substrate 102 in the double BOX wafer 101. The BOX, e.g., silicon dioxide ($SiO_2$), would serve as the first BOX layer 104 in the double BOX wafer 101. By way of example only, the first BOX layer 104 has a thickness of from about 80 nm to about 200 nm, and ranges therebetween. The SOI layer, i.e., a Si layer, would serve as the seed layer 106 in the double BOX wafer 101.

According to an exemplary embodiment, the SOI layer of this starting SOI wafer/seed layer 106 has a thickness of from about 15 nm to about 45 nm, and ranges therebetween. Thus, if necessary, the SOI layer of a commercially available SOI wafer may be thinned (e.g., using a suitable mechanical or chemical etching process, such as chemical mechanical polishing (CMP), or oxidative thinning) to fall within the specified thickness range.

Next, the desired BOX 2 thickness worth of oxide is grown on top of the SOI layer/seed layer 106. This oxide would serve as the second BOX layer 108 in the double BOX wafer 101. By way of example only, the second BOX layer 108 has a thickness of from about 10 nm to about 30 nm, and ranges therebetween. The second BOX layer 108 may be grown in the seed layer 106 using a thermal oxidation process. The resulting thermal oxide (i.e., the second BOX layer 108) would in that case be $SiO_2$. In this case, the starting thickness of the SOI layer would need to be adjusted to accommodate for consumption of silicon during the thermal oxidation process.

In order to form the active layer 110 on the second BOX layer 108, the wafer (which up to this stage has a substrate 102/first BOX layer 104/seed layer 106/second BOX layer 108 configuration) is used as a handle wafer to bond another layer of silicon (e.g., using a standard wafer bonding process). This additional layer of silicon serves as the active layer 110 in the double BOX wafer 101. By way of example only, the active layer 110 has a thickness of from about 10 nm to about 200 nm, and ranges therebetween.

The above-described flow is merely one example of a suitable double BOX wafer forming process. By way of example only, another suitable process for forming a double BOX wafer that may be used in accordance with the present teachings is described in U.S. Pat. No. 8,227,865 B2 issued to Dennard et al., entitled "Low Cost Fabrication of Double BOX Back Gate Silicon-on-Insulator Wafers with Built-In Shallow Trench Isolation in Back Gate Layer," the contents of which are incorporated by reference as if fully set forth herein.

Figure 2:
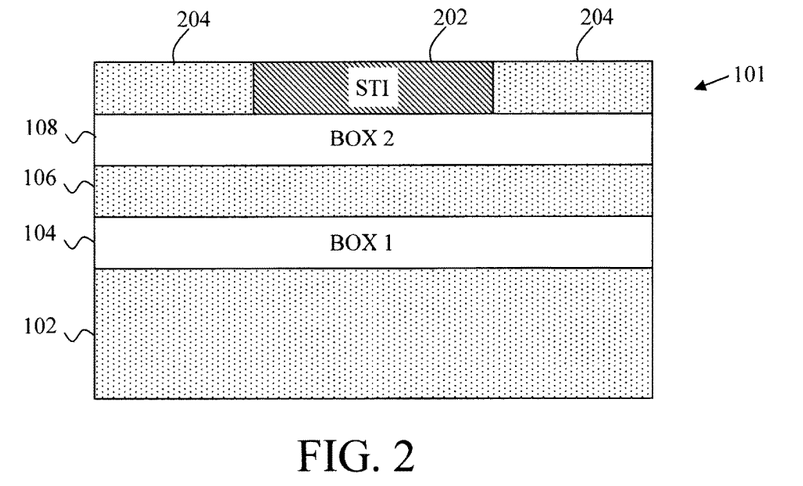
FIG. 2 is a cross-sectional diagram illustrating one or more shallow trench isolation (STI) regions having been formed in the active layer according to an embodiment of the present invention.
Figure 11:
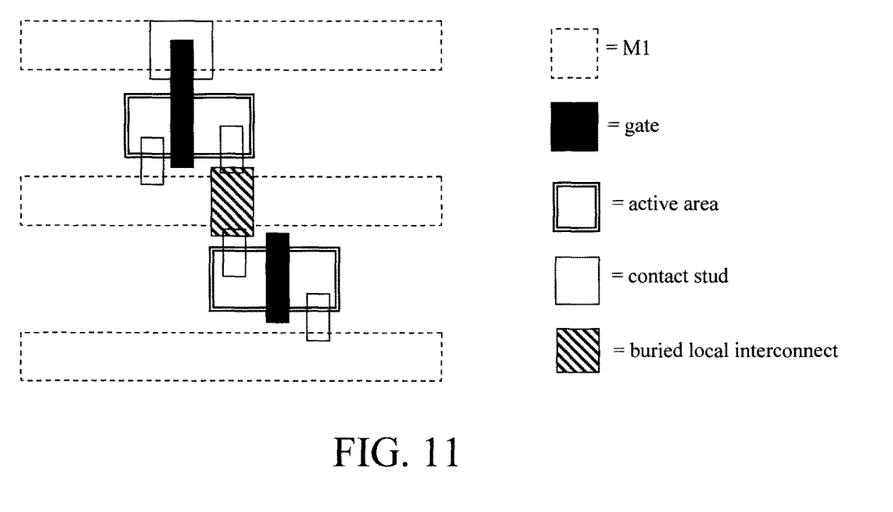
FIG. 11 is a schematic diagram illustrating an exemplary circuit layout employing the present buried local interconnect structures according to an embodiment of the present invention.

Starting with the double BOX wafer 101, formed as described above having a fully depleted seed layer 106, one or more shallow trench isolation (STI) regions 202 are then formed in the active layer 110. See FIG. 2. STI is a standard process known in the art used to isolate active regions of a wafer from one another by etching away unwanted regions of active material (in this case unwanted regions of the active layer 110) and refilling them with an insulating dielectric material. The active regions defined by the STI process in the active layer 110 will hereinafter be given the reference numeral 204. The insulating dielectric material fill, or STI regions 202 may be taller than, coplanar with (i.e., as shown in FIG. 2), or recessed below the surface of the active regions 204. While the figures show a single STI region 202 and a single corresponding local interconnect, this is done for illustrative purposes only and with the understanding that multiple STI regions/local interconnects are possible. Further, many STI regions will have no local interconnects, while some STI regions may contain multiple local interconnects. An exemplary circuit layout is shown in FIG. 11, described below.

As highlighted above, STI involves first patterning a trench(es) in the active layer 110 using standard lithography and etching techniques. As shown in FIG. 2, the etch employed is selective for the active layer 110 (i.e., the underlying second BOX layer 108 serves as an etch stop). The STI trenches are then filled with an insulating dielectric material, such as an oxide material (also referred to herein as an "STI oxide"). In the next step, the STI regions 202 will be patterned such that a portion of the STI oxide remains as a sidewall spacer between what will be the buried local interconnect and the active layer 110.

Figure 3:
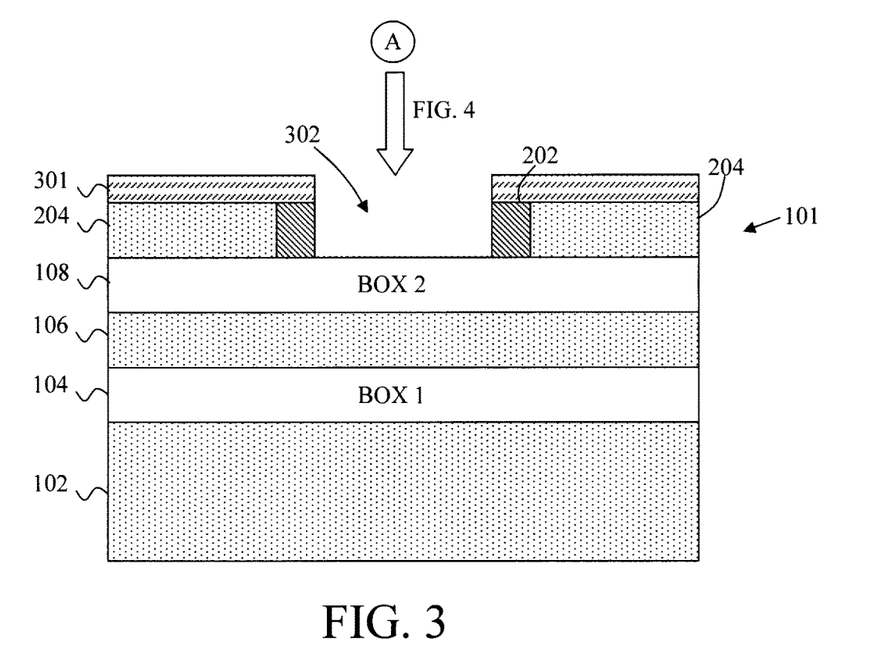
FIG. 3 is a cross-sectional diagram illustrating at least one trench having been patterned in each of the STI regions in a manner such that a portion of the STI oxide remains lining each of the trenches according to an embodiment of the present invention.

Specifically, as shown in FIG. 3, at least one trench 302 is patterned within an STI region(s) 202. Standard lithography and etching techniques may be employed to pattern the trench 302 wherein, for example, a patterned mask 301 is formed on the active regions 204 and the STI region 202 and used to pattern the trench(es) 302. As will be described in detail below, the same patterned mask 301 can be used for the trench etch and during the epitaxial growth of the buried local interconnect structure.

Figure 4:
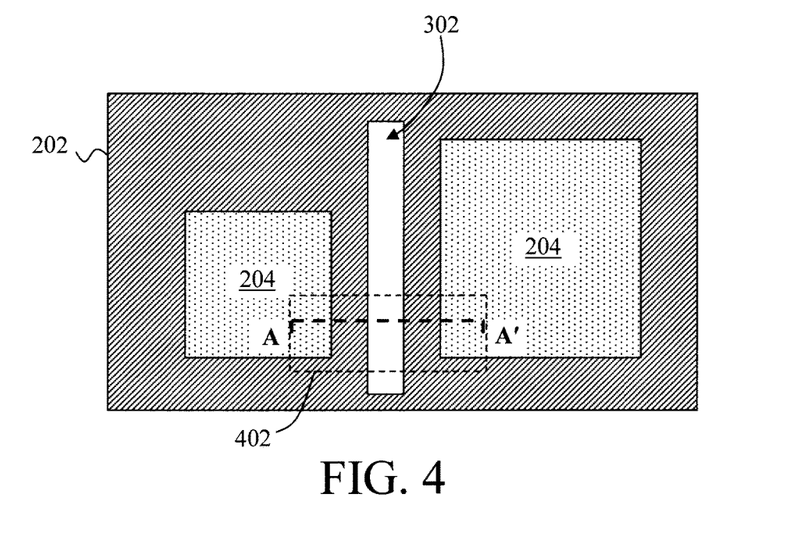
FIG. 4 is a top-down diagram illustrating how the STI oxide fully lines each of the trenches according to an embodiment of the present invention.

The footprint of the trench 302 is such that a portion of the STI oxide remains lining the trench 302. It is notable that the drawings depict cross-sectional cuts through the structure. Thus, the remaining portions of the STI oxide fully line the trenches, separating the trenches from the active regions 204. See, for example, the top view from vantage point A shown in FIG. 4 wherein the mask 301 is not shown so as to illustrate the underlying structures. This STI oxide liner serves two functions. First, lining the trench 302 in the active layer with an oxide insures that epitaxial growth of the buried local interconnect (see below) is seeded only from the seed layer 106. Second, the STI oxide will insulate/separate the buried interconnect from the active layer. It is notable that FIG. 4 provides a wide scale (zoomed-out) top view of the wafer 101 to further illustrate how the active regions 204 may be configured relative to the trenches 302. Thus the view in FIG. 3 and in the other figures illustrating the present process are expanded cross-sectional views of a cut taken, for example, along line A-A' of a section 402 of the wafer. See FIG. 4.

It is further notable that the formation of a single trench 302 between two active regions 204 (as depicted in FIG. 3) is merely one exemplary configuration. Since the trenches 302 correspond to the location and footprint of the buried local interconnects (see below), it is possible to form multiple trenches/buried local interconnects in a single STI region. See, for example, FIG. 5.

Figure 5:
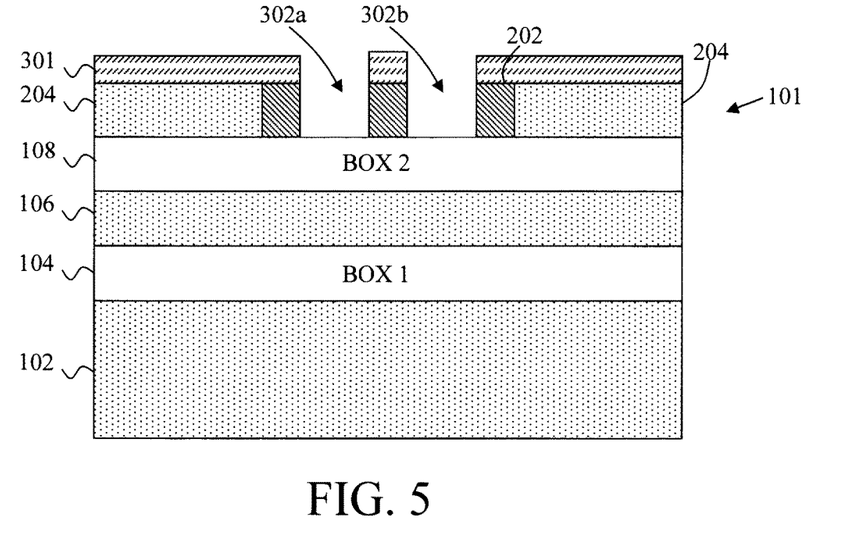
FIG. 5 is a cross-sectional diagram illustrating an exemplary embodiment wherein multiple trenches have been patterned in a given one or more of the STI regions according to an embodiment of the present invention.

In the example shown in FIG. 5, two trenches (e.g., trench 302a and trench 302b) have been patterned in the given STI region 202. The remaining portions of the STI oxide after the trench etch will fully line each of the trenches 302a and 302b, and will separate the trenches from the active regions 204 and from one another. The drawings and description that follows will address the basic scenario wherein a single trench 302 is formed in the STI region 202 with the understanding that multiple trenches 302 and buried local interconnects may be formed in the same manner as described.

Figure 6:
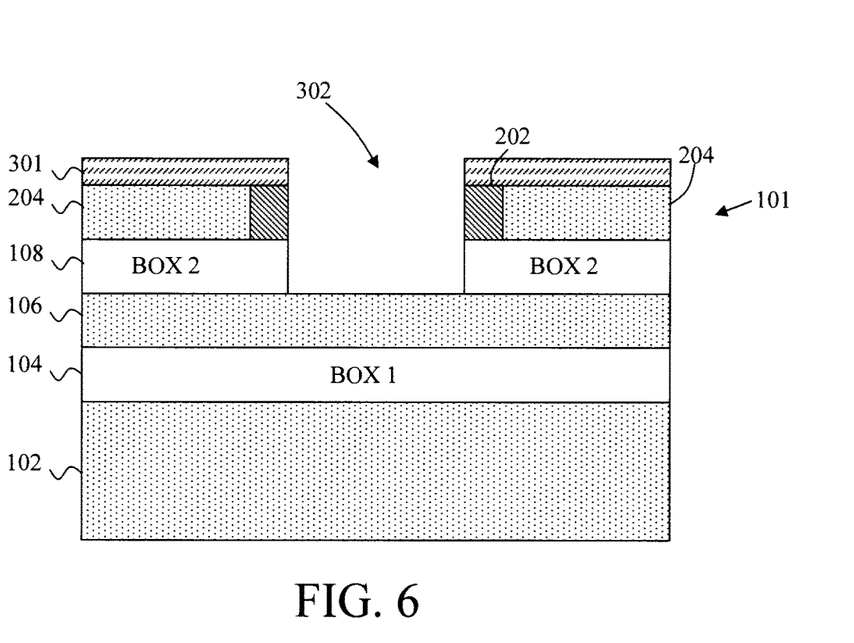
FIG. 6 is a cross-sectional diagram illustrating each of the trenches having been extended down through the second BOX layer according to an embodiment of the present invention.

Again using mask 301, each trench 302 is extended down through the second BOX layer 108. See FIG. 6. While shown as two stages in FIG. 3 and FIG. 6, depending on the particular composition of the STI oxide and the second BOX layer 108, the trench etch through the STI region 202 and the second BOX layer 108 may be performed using a single etching process. For example, an oxide selective reactive ion etching (RIE) process can be used to pattern the trenches 302 through both the STI region 202 and the second BOX layer 108 in a single step with the seed layer 106 acting as an etch stop. It is also possible to endpoint the etch prior to reaching the second BOX layer 108 (as shown in FIG. 3), and then extending the trenches through the second BOX layer 108 (as shown in FIG. 6) via a second etching step. Regardless, the result is one or more trenches 302 that extend through the STI region 202 and the second BOX layer 108 down to the seed layer 106. Accordingly, as shown in FIG. 6, the sidewalls of the trenches 302 are lined with an oxide (a top portion being the STI oxide and a lower portion being the second BOX layer 108).

A doped silicon material is then epitaxially formed in each of the trenches. This doped silicon epitaxial material will serve as the buried local interconnect structure 702. See FIG. 7. While not shown in FIG. 7, mask 301 (used to pattern trenches 302) is preferably left in place during the buried local interconnect epitaxy to prevent growth on the surface of the active layer 110. Layer 106, present at the bottom of the trenches 302 (see, e.g., FIG. 7) serves as a seed layer for the epitaxy and thus will act as a template for the crystallographic orientations of the local interconnect 702. As provided above, the seed layer 106 is undoped, and thus may template the growth of multiple epitaxial buried local interconnect structures 702 (without risk of 'shorting' between the interconnects).

Figure 7:
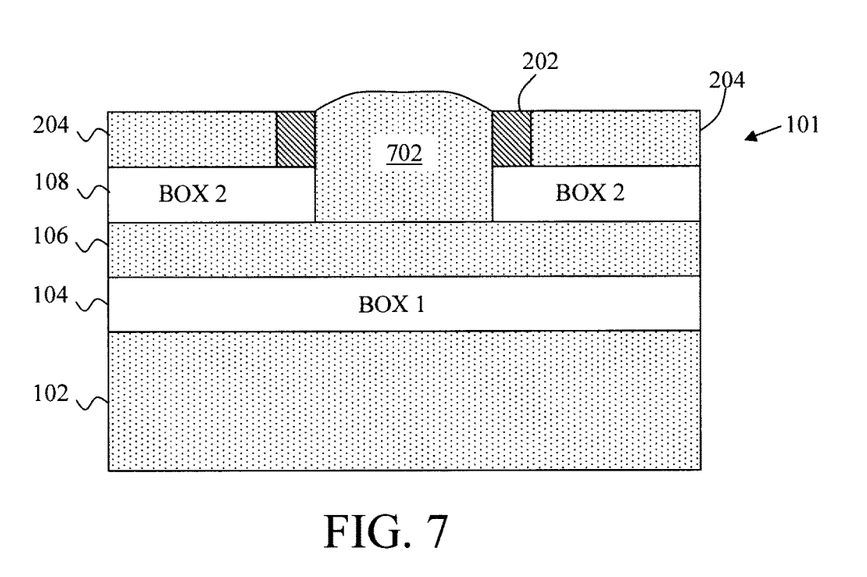
FIG. 7 is a cross-sectional diagram illustrating a doped silicon epitaxial material having been formed in the trenches which will serve as buried local interconnect structures according to an embodiment of the present invention.
Figure 8:
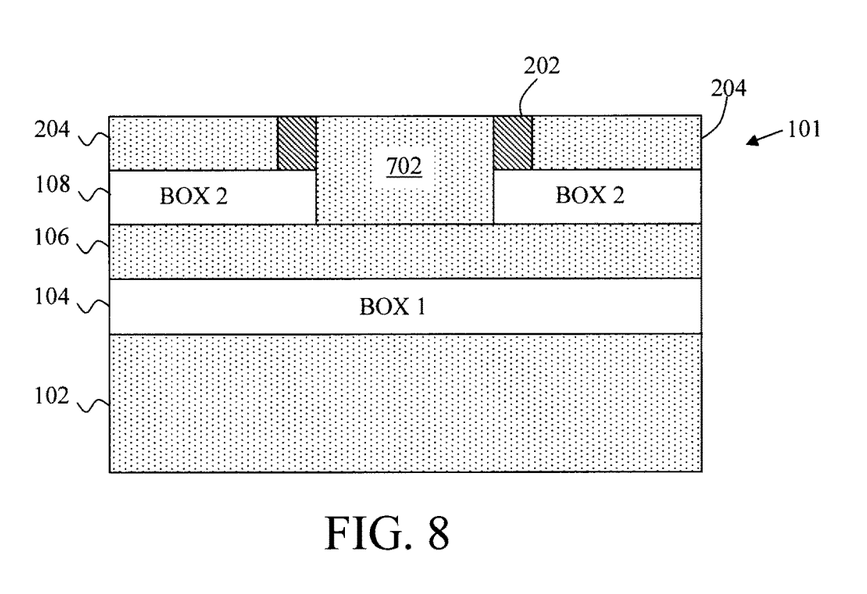
FIG. 8 is a cross-sectional diagram illustrating the epitaxial material having been polished down to the surface of the active layer according to an embodiment of the present invention.

However, in order to serve as an interconnect, each buried local interconnect structure 702 is doped. According to an exemplary embodiment, the local interconnect structures 702 are doped in-situ meaning that the local interconnect structures 702 are doped during the epitaxial growth process. Suitable dopants include, but are not limited to, phosphorous (P) and boron (B). Alternatively, dopants may be implanted into the pre-formed local interconnect structures 702 using standard ion implantation techniques.

Following formation of the local interconnect structures 702, the mask 301 may be removed. The top of the epitaxial material grown for the local interconnects may be taller than (i.e., as shown in FIG. 7), coplanar with, or recessed below the surface of the STI and/or the active regions. See FIG. 7. If a planar surface for subsequent levels is desired, the heterogeneous structure may be planarized such that the top surface of each of the buried local interconnect structures is coplanar with a top surface of the active regions 204. See FIG. 8. A suitable chemical or mechanical etching process may be employed for this step, e.g., chemical mechanical polishing (CMP).

Figure 9:
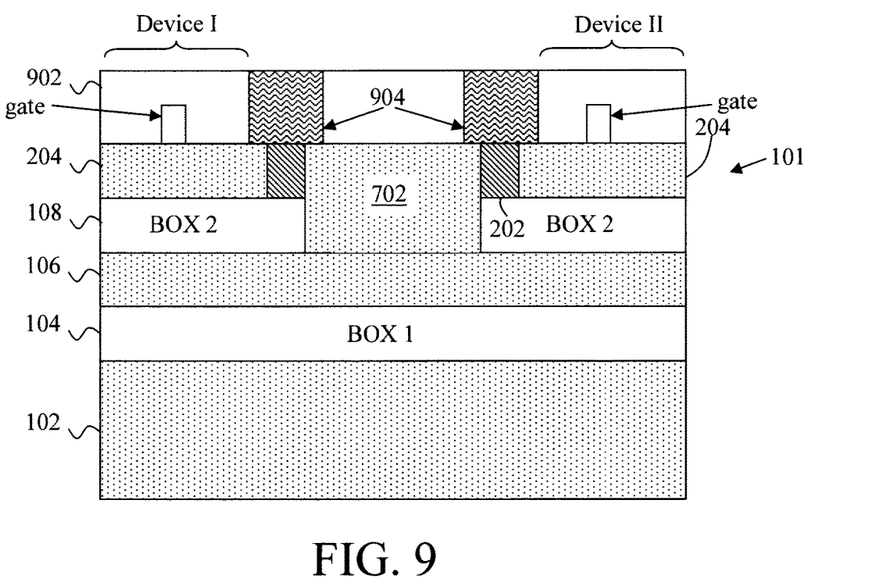
FIG. 9 is a cross-sectional diagram illustrating an exemplary configuration wherein contact studs have been formed linking the buried local interconnect structure and different regions of the active layer according to an embodiment of the present invention.

The now formed structure(s) 702 can serve as buried local interconnects between different devices formed in the active layer. See, for example, FIG. 9. As shown in FIG. 9, a gate has been formed over two different regions of the active layer 110 (i.e., active regions 204), one to the left and one to the right of the buried local interconnect structure 702. In general, a transistor device includes a source region interconnected with a drain region by a channel(s) and a gate(s) that regulates electron flow through the channel. Accordingly, each of the gates shown in FIG. 9 corresponds to a different transistor device formed in the active regions 204 (labeled "Device I" and "Device II"). While not explicitly labeled in FIG. 9, the corresponding source/drain regions of the transistor devices are located in the active layer 110 to the left and to the right of the gates. Contact studs 904 have been formed in contact with both the buried local interconnect structure 702 and the source/drain regions of each of the transistor devices I and II. Thus, via the buried local interconnect structure 702 (and the contact studs 904), one source/drain region of the transistor device I is connected to one source/drain region of the transistor device II. By comparison, with conventional processes, a separate metallization layer would be needed on top of the devices to serve this same function. While the resistance of a local interconnect formed from doped silicon would be higher than that of a typical metal line, for short distances this is often acceptable. Further, an epitaxially grown crystalline material (as per the present techniques) reduces resistance as compared to an amorphous material. Using doped silicon rather than metal for local interconnects at this point in the process is preferable because doped silicon is compatible with the high thermal budget associated with typical MOSFET fabrication processes, such as dopant activation and gate stack formation and anneals. Most front-end-of-line processes are not compatible with metals fills.

By way of example only, the contact studs 904 shown in FIG. 9 might be formed by the following process. Once the gates have been formed (i.e., by standard gate material deposition, lithography and etching), they may be buried in an insulating dielectric material 902, such as an oxide material. The insulating dielectric material 902 may then be patterned with the footprint and location of the contact studs 904. A metal(s) may then be deposited into the patterned insulating dielectric material 902 to form the contact studs 904.

Figure 10:
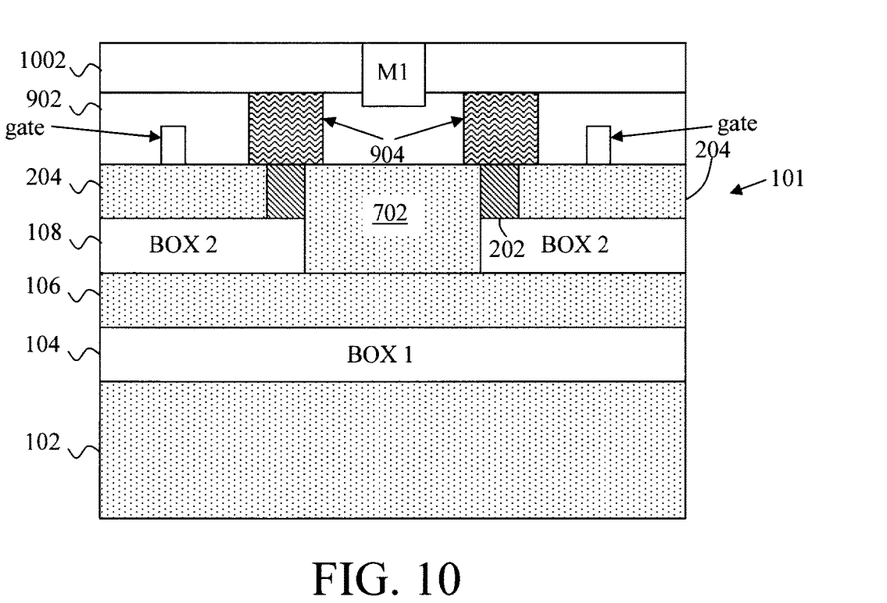
FIG. 10 is a cross-sectional diagram illustrating an additional metallization layer having been formed over the contact studs according to an embodiment of the present invention.

Additionally device, metallization, etc. layers may be fabricated. See, for example, FIG. 10. As shown in FIG. 10, the contact studs are buried in an insulating dielectric material 1002 (e.g., the same oxide material as insulating dielectric material 902). An M1 metallization pattern is formed in the insulating dielectric material 1002 and then filled with a metal(s) to form an M1 metallization layer of the wafer. While shown in FIG. 10 as being coplanar with the insulating dielectric material 1002, the M1 metal layer may also be elevated.

FIG. 11 provides an exemplary circuit layout employing the present buried local interconnect structures. A key to the pattern used for each of the components in the layout is provided to the right of the figure. The exemplary layout includes gates over multiple active areas. As described above, the active areas of a transistor device include a source, drain, and channel. The present buried local interconnect structure (such as buried local interconnect structure 702) is used to interconnect the active regions (via contact studs such as contact studs 904). As described in conjunction with the description of FIG. 10, above, one or more additional metallization layers (such as metallization layer M1) may be formed over the contact studs.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a local interconnect structure, comprising the steps of:
   forming a double buried oxide (BOX) silicon-on-insulator (SOI) wafer having a seed layer between a first BOX layer and a second BOX layer, and an active layer over the second BOX layer, wherein the seed layer is undoped and has a thickness of less than 200 nanometers;
   forming at least one shallow trench isolation (STI) region in the active layer comprising an STI oxide;
   forming at least one trench that extends through the STI oxide, stopping on the second BOX layer;
   extending the trench through the second BOX layer down to the seed layer, wherein the trench has a footprint and a location such that a portion of the STI oxide remains lining sidewalls of the trench and that the sidewalls of the trench are lined by a combination of the STI oxide and the second BOX;
   growing an epitaxial material in the trench, having the footprint and location of the trench, using the seed layer as a template for the growth, wherein the epitaxial material is doped and serves as the local interconnect structure which is buried in the double BOX SOI wafer;
   depositing an insulating dielectric on the active layer and the local interconnect structure; and
   forming contact studs in the insulating dielectric, wherein the contact studs are present over the STI oxide and in direct contact with both the local interconnect structure and one or more active regions of the active layer.

2. The method of claim 1, wherein the seed layer has a thickness of from about 15 nanometers to about 45 nanometers.

3. The method of claim 1, wherein the seed layer comprises silicon.

4. The method of claim 1, wherein the step of forming the double BOX SOI wafer comprises the steps of:
   providing a preformed SOI wafer having a SOI layer over a first BOX layer, wherein the SOI layer serves as the seed layer, and wherein the first BOX serves as the first BOX layer in the double BOX SOI wafer;
   growing a second BOX layer on a side of the SOI layer opposite the first BOX layer, wherein the second BOX layer serves as the second BOX layer in the double BOX SOI wafer; and
   transferring a silicon wafer onto a side of the second BOX layer opposite the SOI layer which serves as the active layer in the double BOX SOI wafer.

5. The method of claim 1, further comprising the step of:
   polishing the epitaxial material down to a top surface of the active layer such that a top surface of the epitaxial material and the top surface of the active layer are coplanar with one another.

6. The method of claim 1, further comprising the steps of:
   forming gates over the active regions of the active layer, one of the gates being on a first side of the local interconnect structure and another of the gates being on a second side of the local interconnect structure opposite the first side; and
   burying the gates in the insulating dielectric.

7. The method of claim 1, wherein the epitaxial material is doped in-situ during growth of the epitaxial material in the trench.

8. The method of claim 1, wherein the epitaxial material is doped with phosphorous or boron.

9. The method of claim 1, wherein the portion of the STI oxide which remains lining the sidewalls of the trench separates the local interconnect structure from the active layer.

10. The method of claim 1, further comprising the steps of:
    forming a patterned mask on the active layer;
    using the patterned mask to form the trench in the STI region, wherein the patterned mask covers the portion of the STI oxide lining the sidewalls of the trench; and
    using the patterned mask to extend the trench through second BOX layer wherein, based on a configuration of the patterned mask, the second BOX layer remains directly beneath the portion of the STI oxide lining the sidewalls of the trench.

11. The method of claim 1, further comprising the step of:
    forming multiple trenches in the STI oxide that extend through the STI oxide down to the second BOX.

* * * * *